United States Patent [19]

Ayala-Esquilin et al.

[11] Patent Number: 5,441,690
[45] Date of Patent: Aug. 15, 1995

[54] PROCESS OF MAKING PINLESS CONNECTOR

[75] Inventors: Juan Ayala-Esquilin, San Jose, Calif.; Brian S. Beaman, Hyde Park; Rudolf A. Haring, Cortlandt Manor, both of N.Y.; James L. Hedrick, Pleasanton, Calif.; Da-Yuan Shih, Poughkeepsie; George F. Walker, New York, both of N.Y.

[73] Assignee: International Business Machines Corporation, Armonk, N.Y.

[21] Appl. No.: 88,016

[22] Filed: Jul. 6, 1993

[51] Int. Cl.6 .................. B29C 33/42; B32B 15/02
[52] U.S. Cl. ..................... 264/277; 156/73.1; 156/73.2; 156/155; 156/329; 264/221; 264/317; 428/447; 428/450
[58] Field of Search .......... 428/209, 447, 450, 457; 524/403, 432; 439/91; 156/73.1, 73.2, 155, 329; 264/221, 277, 317

[56] References Cited

U.S. PATENT DOCUMENTS

| | | | |
|---|---|---|---|
| 3,142,655 | 7/1964 | Bobear | 524/403 |
| 4,366,278 | 12/1982 | Hamada et al. | 524/210 |
| 4,461,854 | 7/1984 | Smith | 523/211 |
| 4,548,451 | 10/1985 | Benarr et al. | 339/17 M |
| 4,680,363 | 7/1987 | Beers | 528/14 |
| 4,778,950 | 10/1988 | Lee et al. | 174/356 |
| 4,824,903 | 4/1989 | Aizawa et al. | 524/772 |
| 4,942,211 | 7/1990 | Sommer et al. | 528/14 |
| 4,970,098 | 11/1990 | Ayala-Esquilin et al. | 428/36.4 |
| 5,086,558 | 2/1992 | Grube et al. | 29/832 |
| 5,122,562 | 6/1992 | Jeram et al. | 524/403 |
| 5,123,849 | 6/1992 | Deak et al. | 439/66 |

FOREIGN PATENT DOCUMENTS

| | | | |
|---|---|---|---|
| 024498A1 | 3/1981 | European Pat. Off. | C09K 5/00 |
| 475022A1 | 3/1992 | European Pat. Off. | H01L 23/498 |

*Primary Examiner*—D. S. Nakarani
*Attorney, Agent, or Firm*—Robert B. Martin

[57] ABSTRACT

The present invention relates to an improved pinless connector for use in microelectronics comprising an improved elastomer resin of polysiloxane and filler.

3 Claims, 1 Drawing Sheet

PROCESS OF MAKING PINLESS CONNECTOR

FIELD OF THE INVENTION

The present invention relates to an improved pinless connector for use in microelectronics and in particular relates to a pinless connector comprising an improved elastomer.

BACKGROUND OF THE INVENTION

In the manufacture of circuit assemblies for large computers, a plurality of integrated circuits such as semiconductor chips are generally mounted on a multichip module. A multichip module is an intermediate level of packaging between the chips and the circuit board. Multichip modules are made up of a plurality of insulating and conducting layers wherein the conducting, power, signal and ground layers deliver power to the chips and distribute the input/output signals between chips on the module or to/from the circuit board. Multichip modules typically contain input/output pins on the bottom surface for connection to the circuit board. However, in some cases, the pin connection between the module and the circuit board are unsuitable for high frequency applications due to the high inductance and capacitance coupling generally caused by the longer pin length.

In order to overcome this problem, pinless elastomeric connectors also known as interposer connectors were developed. Pinless connectors generally comprise conductive particles or fine wires embedded in an elastomeric material. The preferred pinless connector comprises a multitude of spaced apart fine wires embedded in an elastomeric material. The wires extend through the material to opposite surfaces of the material. The pinless connector is sandwiched and compressed between two mated electronic components such as a module and circuit board to provide electrical contact.

Prior pinless connectors utilized silicon rubber as the elastomeric material for the connector. It is desired that an elastomeric material for the pinless connector have a unique combination of thermal, mechanical and electrical properties. The silicon rubber experiences thermal degradation during use which can result in reliability problems.

It is therefore an object of the present invention to provide a pinless connector comprising an improved elastomer. Other objects and advantages will become apparent from the following disclosure.

SUMMARY OF THE INVENTION

The present invention relates to an electrical connector and process for making the connector. The connector comprises a dielectric composition having a first and second opposing surfaces and a plurality of electrically conducting wires extending from the first to the second opposing surface of the electrical connector, wherein the dielectric composition comprises a crosslinked polysiloxane having a high tensile strength greater than about 170 psi. The connector is formed by disposing uncrosslinked polysiloxane composition around the wires, where the uncrosslinked polysiloxane composition comprises (i) about 70 to 90 weight % of random copolymer of dimethylsiloxane and diphenylsiloxane and (ii) about 10 to 30 weight % of filler comprising zinc oxide and an oxide of an element in the lanthanide series. The uncrosslinked composition has a viscosity less than 5500 centipoise. The composition is then crosslinked by hydrosilation.

Preferably the uncrosslinked copolymer has a number average molecular weight (Mn) of about 15,000 to 35,000 g/tool and comprises about 70 to 85 weight % of the dimethylsiloxane and about 15 to 30 weight % of the diphenylsiloxane.

The uncrosslinked resin with the generally lower filler content has a low viscosity to enable the resin to be disposed around the multitude of fine wires without displacing the wires. Surprisingly upon curing, the resin acquires superior mechanical and thermal properties to result in an improved pinless connector.

A more thorough disclosure of the present invention is presented in the detail description and drawings.

DETAILED DESCRIPTION OF THE INVENTION

Figure 1:
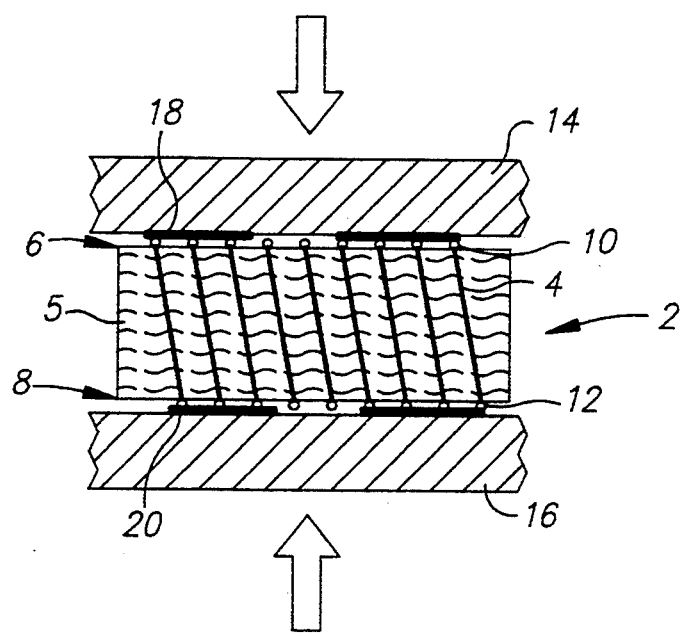
FIG. 1 is a cross-sectional view of the pinless connector sandwiched between two mated electronic components.

The present invention relates to an improved pinless connector comprising an improved elastomeric resin composition. The elastomer comprises a copolymer and filler.

The copolymer of the composition is a random copolymer of dimethylsiloxane and diphenylsiloxane. The copolymer generally comprises about 70 to 85 weight % of dimethylsiloxane and about 15 to 30 weight % of diphenylsiloxane. Preferably the copolymer comprises about 20-25 weight % of the diphenylsiloxane which provides the thermal stability to the crosslinked resin without substantially increasing the viscosity of the uncrosslinked resin. It is desired that the viscosity of the uncrosslinked elastomer composition be below about 2,500 centipoise to enable the composition to be disposed around the multitude of fine wires of the pinless connector without dislocation of the wires. It is desired that the crosslinked elastomer composition have high thermal stability to withstand the processing conditions and minimize outgassing. The copolymer of the present invention uniquely provides both of these properties. The thermal stability of the crosslinked elastomer can be further enhanced by minimizing the crosslink junctions, which is achieved by utilizing high molecular weight resin with reactive groups only at the chain ends. Preferred number average molecular weight (Mn) of (he uncrosslinked copolymer was found to be between 15,000 and 35,000 g/mol. Higher molecular weights are more difficult to cure and, in combination with the filler, have a higher viscosity than desired.

Vinyl terminated dimethyldiphenylsiloxane copolymer (oligomer) can be synthesized by a base catalyzed anionic equilibrium reaction. The $\alpha$, $\omega$-bis(vinyl) tetramethyldisiloxane is reacted with various combinations of the cyclic tetramer of dimethylsiloxane and diphenylsiloxane using tetramethyl ammonium hydroxide pentahydrate as the catalyst.

One problem with the silicone based elastomers in prior art pinless connectors was outgassing of volatile impurities during the fabrication and use. Outgassing involves the evolution of small molecules which can leave voids in the polymer and contaminate the surrounding components. The outgassing of the elastomers of the present invention is minimized (particularly at temperatures below 300° C.) by subjecting the uncrosslinked resin to a thin film distillation to remove low molecular weight by-products formed during the resin synthesis. The purified uncrosslinked copolymer has less than 3 weight % preferably less than 1 weight %) of volatile products (i.e., low molecular weight synthetic by-products which are volatile at the microelectronic use temperature about 50° to 100° C.). The purified copolymer generally has a viscosity of about 2,000 to 3,500 centipoise, and preferably about 2,500 centipoise.

The composition also comprises filler preferably comprising two metallic oxides selected From zinc oxide and a second oxide selected From an oxide of an element in the lanthanide series, a lanthanide oxide, preferably ceric dioxide, neodymium oxide, samarium oxide or curopium oxide or mixtures thereof. Preferably, the composition comprises about 7 to 29 weight % of the zinc oxide and about 1 to 3 weight % of the second oxide. Surprisingly, the addition of the filler to the copolymer does not substantially increase the viscosity of the copolymer. The elastomeric composition comprising the uncrosslinked copolymer and filler will have a relatively low viscosity less than 5500 centipoise, preferably less than about 4000 centipoise, more preferably less than about 3,800 centipoise, to facilitate the formation of the pinless connector.

The viscosity of the filled resin and the shelf-life or dispersion stability can be further enhanced by surface treatment of the fillers. Methyl trimethoxy silane was found to be suitable for zinc oxide and enhances a stable dispersion. In addition, the adhesion of the elastomer/filler combination to metal is significantly enhanced by the use of commercially available (Dow Corning) adhesion promoters.

The pinless connector is formed by disposing the uncrosslinked composition around the electrically conducting wires. A standard pinless connector will generally comprise a great number (about 1,000 or more) of fine copper or gold alloy wires having a diameter of less than 10 mils preferably less than 5 mils more preferably less than 3 mils. The wires are generally closely spaced together being spaced apart about 8-100 mils. An important step in the production of the connector is disposing the elastomeric composition around the wires without displacing or dislocating the wires. It is important that the viscosity of the uncrosslinked composition be less than about 5500 centipoise to avoid displacing or dislocating the wires. The connector can be formed by placing the wires into the composition or alternatively flowing the composition around the wires. Preferably the connector is formed by injection molding the composition around the wires.

After the uncrosslinked composition has been disposed around the wires, the composition is crosslinked via hydrosilylation chemistry standard industry preferably using a hindered (proparygl alcohol) platinum catalyst in a reactive silicone oil (i.e., the oil contains reactive groups to prevent its outgassing during subsequent processing or use). The crosslinked composition preferably has a high tensile strength greater than about 170 psi preferably greater than about 220 psi and more preferably greater than 240 psi. The crosslinked composition also has compression set less than 1% preferably less than 0.5% and a compressibility (compliance) of 10% displacement at 50 psi, preferably 10% displacement al 30 psi. The crosslinked composition also has high thermal stability with thermal decomposition of less than 0.1 weight %/hour at 300° C. preferably less than 0.06 weight %/hour.

A preferred pinless connector is shown in FIG. 1. The connector 2 generally comprises a plurality of fine electrical conductor (wires) 4 disposed in the elastomeric composition 5 of the present invention and extend from side 6 of the connector to side 8 of the connector. Each conductor 4 preferably has a generally spherical end 10 at side 6 and a flattened spherical shape 12 at side 8. The conductors 4 are preferably gold, gold alloy or copper alloy, and the size, shape and the spacing of wires 4 can be modified to optimize the connector for a specific application.

The connector is disposed between mated electronic components 14 and 16 such as an integrated circuit chip and a multichip module. The components 14 and 16 are provided with electrical contact pads 18 and 20. The components 14 and 16 are pressed towards each other as indicated by arrows with the connector therebetween. The dielectric composition 5 acts as a spring to push the end contact surfaces 10 and 12 against mating contacts 18 and 20 on components 14 and 16 respectively thereby maintaining good electrical contact.

Figures 2, 3:
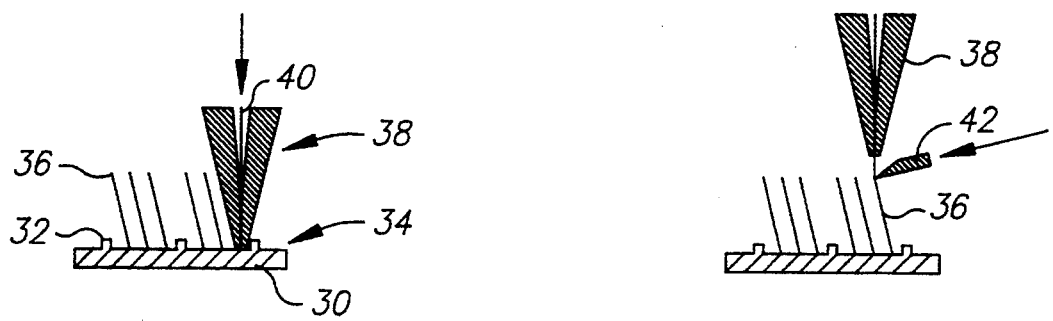
FIGS. 2-4 show the process for making the pinless connector.

The connector can be fabricated in a variety of art known methods. Referring to FIG. 2, conveniently the fabrication process starts with a sacrificial substrate 30, which is preferably copper, copper/Invar/copper or copper/molybdenum copper. Materials other than copper can be used such as aluminum, hard plastic or steel. The substrate 30 can be fabricated to have protuberances 32 which provide alignment grooves in connector surface. Such alignment grooves are particularly desired if the conductor are clustered in patterns to align the wires with the contact pads of the electrical components. The protuberances 32 can be formed using various fabrication techniques including machining of the surface or stamping of the surface. After the substrate has been formed, the top surface 34 is sputtered or plated with soft gold or a Ni/Au to provide a suitable surface for thermosonic ball bonding. Other bonding techniques can be used such as thermal compression bonding, ultrasonic bonding, laser bonding and the like. A commonly used automatic wire bonder is modified to ball bond gold, gold alloy, copper, copper alloy, aluminum, nickel or palladium wires 36 to the substrate surface 34 as shown in FIG. 2. If a metal other than Au is used, a thin passivation metal such as Au, Cr, Co, Ni or Pd can be coated over the wire by means of electro-, or electroless plating, sputtering, e-beam evaporation or any other coating techniques known in the industry. Structure 38 of FIG. 2 is the ball bonding head which has a wire 40 being fed from a reservoir of wire as in conventional wire bonding apparatus. FIG. 2 shows the ball bond head 38 in contact with surface 34 of substrate 30. FIG. 3 shows the ball bonding head 38 withdrawn from the surface 34 anal the wire 36 drawn out. The bond wire is preferably positioned at an angle preferably between 5° to 60° from vertical and then mechanically severed by knife edge 42. When the wire 36 is severed there is left on the surface of the substrate a wire which is bonded to surface at one end and projects outwardly away from the surface. Optionally, a ball can be formed on the end of the wire 36 using a laser or electrical discharge to melt the end of the wire. Techniques for this are commonly known in the art. A split beam laser delivery systems is used to localize the laser energy to a single wire for forming the ball. This minimizes the laser energy absorbed by adjacent wires that could cause the wires to deform.

After the wire is severed, the bond head is raised. An electrode is positioned below the bond head and an electrical discharge from the electrode is used to melt the wire in the capillary tip to form a ball on the end of the wire. The wire bonding process is repeated to form a dense array of angled wires on the substrate.

Figure 4:
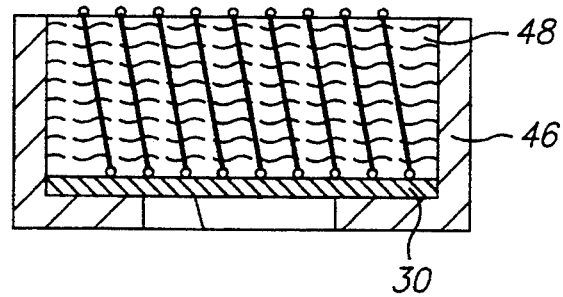

After the wire bonding process is completed, the substrate 30 is placed in a casting mold 46 as shown in FIG. 4. A controlled volume of uncrosslinked liquid elastomer composition 48 of the present invention is disposed into the casting mold and allowed to settle out (flow between the wires until the surface is level). Alternatively, the substrate 30 can be placed in an injection molder the uncrosslinked composition injected around the wires. In this process embodiment, the free end of wires 36 are protected from the composition by dipping them into a water soluble polymer such as polyvinyl alcohol which is removed after curing. After the elastomer has cured, the connector is then removed from the mold and placed in a sulfuric acid bath to dissolve the substrate 30. Ultrasonic agitation of the sulfuric acid helps to facilitate the etching of the copper substrate and causes the gold plating on the surface of the copper substrate to Flake off from the surface of the structure leaving the surface of the ball ends exposed.

The following example is a detailed description of methods of preparation and use of certain compositions of the present invention. The detailed preparations fall within the scope of, and serve to exemplify, the more generally described methods of preparation set forth above. The examples are presented for illustrative purposes only, and are not intended as a restriction on the scope of the invention.

EXAMPLE

The $\alpha$, $\omega$-bis(vinyl)dimethyldiphenylsiloxane oligomers of various molecular weights were synthesized by base (tetraethylammonium hydroxide pentahydrate) catalyzed-bulk anionic equilibrium reaction of octamethylcyclotetrasiloxane ($D_4$) and octaphenylcyclotetrasiloxane ($D''_4$) with 1,3-bis(aminopropyl)-tetramethyl disiloxane end blocker. The $D''_4$ is a crystalline solid and is not soluble in the mixture of $D_4$ and end-blocking agent. However the $D''_4$ is soluble in oligomers or dimethylsiloxane. Therefore, these coequilibrations had to be performed sequentially. First, the $D_4$, end-blocking agent, and catalyst were charged and heated to 80° C., yielding oligomers of dimethylsiloxane after about 2 hours. The cyclic tetramer of diphenylsiloxane was then charged and allowed to coequilibrate. The oligomers containing the higher siloxane content had to be healed to 150° C. to form a homogeneous reaction mixture and then cooled to 80° C. The reaction temperature was maintained at 80° C. for 48 hours and then increased to 150° C. for 5 hours to decompose the catalyst. This step is desired because residual catalyst may result in further equilibration each time evolving 15-20 weight % of the volatile cyclic tetramer, thereby leading to outgassing. The oligomers were heated (150° C.) under (0.05-0.10 mmHg) vacuum to remove the equilibrium cyclics.

The poly(dimethyldiphenyl)siloxane resin was then placed in a planetery mixer along with 3.5 to 7 weight % of silygard 182 curing agent and a platinum catalyst (~10 ppm) inhibited with proparygl alcohol in a reactive silicone oil. The mixer was then charged in three separate runs with 8, 18 and 28 weight % zinc oxide and 2 weight % cerium oxide. To this mixture approximately 5 weight % methoxytrimethylsilane was added as an "in situ" filler treatment. The mixture was heated to 80° C. under vacuum while stirring For 24 hours. The methanol, a side product of the filler treatment was removed during this step.

Crosslinking was achieved by placing the resin i.e., pouring or injection molding) in the appropriate configuration and heating to 200° C. for 2 hours to effect the network formation. The properties of the crosslinked article are shown in Table 1. The crosslinked resin showed good compression strength and minimal compression set (i.e., <1% from 14 psi (48 hours). The crosslinked resin also showed exceptional thermal stability with decomposition temperatures over 440° C. ($N_2$) and isothermal weight loss upon aging at 350°, 300°, 250° and 200° C. of 0.19, 0.06, 0.02 and 0.009 weight %/hour. The compliance of the composition was 10% displacement at 33 psi.

TABLE 1

| Characteristics of filled polydimethyldiphenylsiloxane elastomers | | | | | |
|---|---|---|---|---|---|
| Uncrosslinked | | | Crosslinked | | |
| Filler Composition, wt % | Viscosity (CPS) | Durometer (Shore A) | Tear Strength (psi) | Tensile Strength (psi) | Elongation % |
| 10 | 2700 | 16 | 20 | 170 | 230 |
| 20 | 3650 | 19 | 36 | 255 | 275 |
| 30 | 5100 | 24 | 40 | 280 | 230 |

Although this invention has been described with respect to specific embodiments, the details thereof are not to be construed as limitations for it will be apparent that various embodiments, changes, and modifications may be resorted to without departing from the spirit and scope thereof, and it is understand that such equivalent embodiments are intended to be included within the scope of this invention.

We claim:

1. A process for making an electrical connector comprising a dielectric composition having first and second opposing surfaces and a plurality of electrically conducting wires having a diameter less than 10 mils extending from the first to the second opposing surface of the electrical connector, the dielectric composition comprising a crosslinked polysiloxane composition having a tensile strength greater than 170 psi, the process comprising the steps of:
    (a) disposing uncrosslinked polysiloxane composition having a viscosity less than 5500 centipoise around a plurality of unsupported electrically conducting wires bonded to a sacrificial substrate, said uncrosslinked polysiloxane composition comprising (i) about 70 to 90 weight % of random copolymer of dimethylsiloxane and diphenylsiloxane and (ii) about 10 to 30 weight % of filler comprising zinc oxide and a lanthanide oxide;
    (b) hydrosilation crosslinking of the polysiloxane composition and
    (c) removing the sacrificial substrate.

2. The process of claim 1 wherein the lanthanide oxide is selected from ceric dioxide, neodymium oxide, samarium oxide or curopium oxide.

3. The process of claim 2 wherein the uncrosslinked composition has less than 3 weight % of volatile product in the resin.

* * * * *